United States Patent [19]
Yano

[11] Patent Number: 5,926,520
[45] Date of Patent: Jul. 20, 1999

[54] SHIFT REGISTER FUNCTIONING IN BOTH LATCH MODE AND COUNTER MODE AND FLASH MEMORY EMPLOYING SAME

[75] Inventor: Masaru Yano, Sunnyvale, Calif.

[73] Assignee: Fujitsu Limited, Kanagawa, Japan

[21] Appl. No.: 08/885,174

[22] Filed: Jun. 30, 1997

[30] Foreign Application Priority Data

Aug. 23, 1996 [JP] Japan ................................ 8-222619

[51] Int. Cl.$^6$ .............................................. G11C 19/00
[52] U.S. Cl. .............................. 377/80; 377/26; 377/81
[58] Field of Search .................................. 327/202, 203; 377/26, 54, 77, 80, 81, 116, 64; 365/189.12

[56] References Cited

U.S. PATENT DOCUMENTS

| | | | |
|---|---|---|---|
| 4,786,829 | 11/1988 | Letcher | 307/465 |
| 5,015,875 | 5/1991 | Giles et al. | 307/272.2 |
| 5,130,568 | 7/1992 | Miller et al. | 307/272.2 |
| 5,633,606 | 5/1997 | Gaudet et al. | 327/202 |
| 5,719,878 | 2/1998 | Yu et al. | 371/22.3 |

*Primary Examiner*—Kenneth B. Wells
*Assistant Examiner*—Hai L. Nguyen
*Attorney, Agent, or Firm*—Nikaido; Marmelstein; Murrray & Oram LLP

[57] ABSTRACT

The shift register includes a front stage latch portion for inputting input data when a clock signal is at a first level and latching the input data when the clock signal is at a second level, a rear stage latch portion for inputting data from the front stage latch portion when the clock signal is at the second level and latching the input data when the clock signal is at the first level, an input switch for connecting a data input terminal to the front stage latch portion when a mode switching signal is at a first level, and a feedback switch for connecting the rear stage latch portion to the front stage latch portion when the mode switching signal is at a second level. A latch mode clock signal is provided as the aforementioned clock signal when the mode switching signal is at the first level, and a counter mode clock signal or front stage shift register latch output signal is provided as the aforementioned clock signal when the mode switching signal is at the second level. The shift register functions in latch mode when the mode switching signal is at the first level, and functions with a plurality of stages thereof as a counter when at the second level. A flash memory equipped with the above shift registers which have a function whereby command flags of decoded external command signals are latched, and a counter function whereby counting is performed with the plural shift register stages.

1 Claim, 9 Drawing Sheets

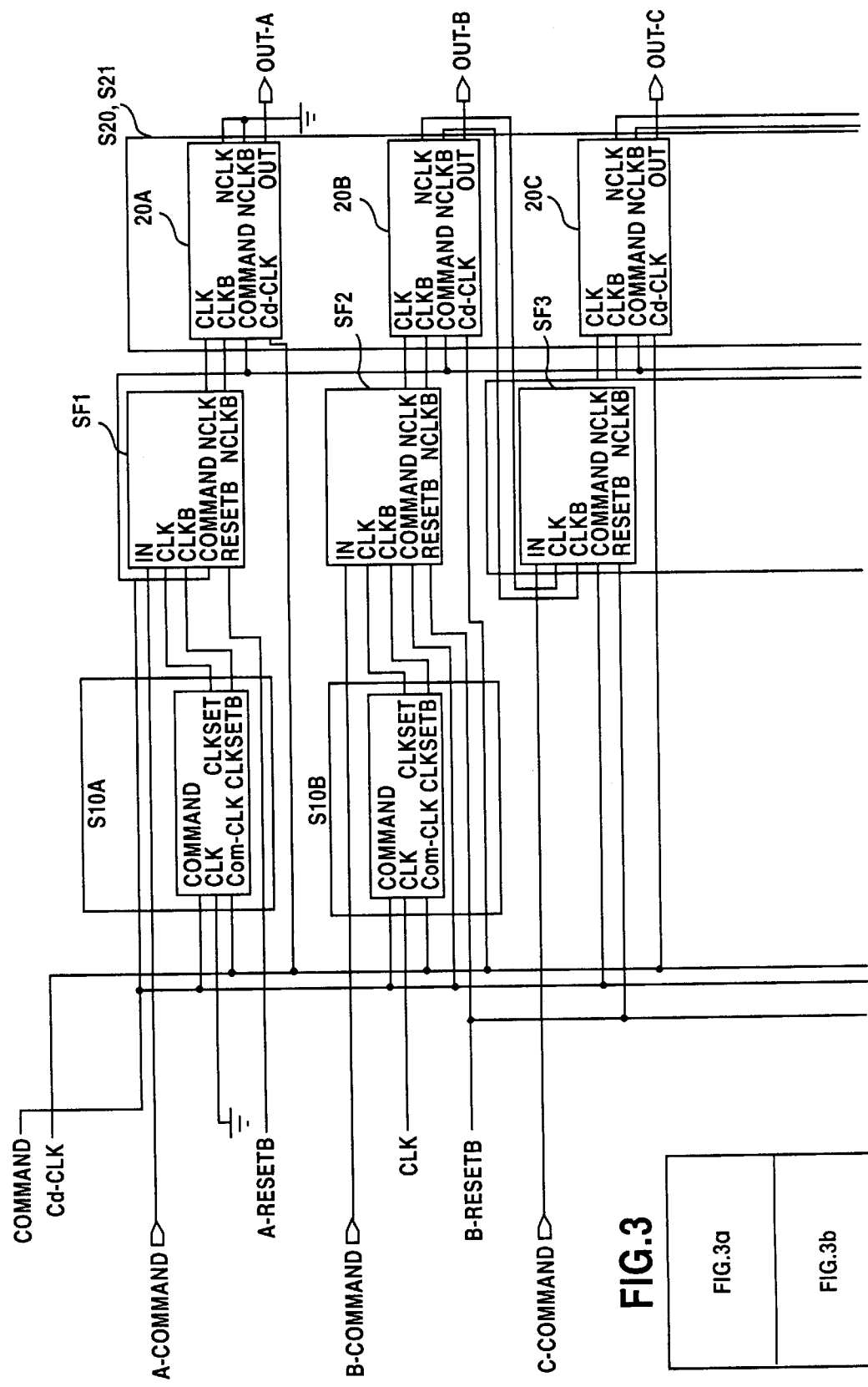

SHIFT REGISTER FUNCTIONING IN BOTH LATCH MODE AND COUNTER MODE AND FLASH MEMORY EMPLOYING SAME

BACKGROUND OF THE INVENTION

1. Field of the Invention

The present invention relates to a shift register for use in semiconductor memory devices and the like, and more particularly to an improved shift register having both a mode whereby external commands are temporarily latched and a mode whereby the element functions as a counter for time measurement, and to a flash memory utilizing this shift register.

2. Description of the Related Art

In flash memories and other semiconductor memory devices, external commands instructing write, read, delete, or other operations are decoded, and corresponding command flags are stored in memory. Shift registers are provided for latching the decoded command flags.

In flash memories, it is necessary to apply erasing voltage to the memory transistor gates for a given period of time in order to erase the contents. An internal timer comprising a counter which measures the erase time is provided for this purpose.

However, latching shift registers and the shift registers which make up counters have the same circuit architecture, and, according to internal circuit operation theory, are not used simultaneously in some instances. Accordingly, the provision of both latching shift registers and counter shift registers as internal circuits makes the circuit architecture unnecessarily complex, and increases the degree of integration.

SUMMARY OF THE INVENTION

In view of the foregoing, it is an object of the present invention is to provide a shift register circuit that can function both as a data latching circuit and as a counter register circuit.

A further object of the present invention is to provide a flash memory that utilizes this shift register circuit.

To achieve the aforementioned objects, the shift register of the present invention comprises a front stage latch portion for inputting input data when the clock signal is at a first level and latching the input data when the clock signal is at a second level, a rear stage latch portion for inputting data from the front stage latch portion when the clock signal is at the second level and latching the input data when the clock signal is at the first level, an input switch for connecting a data input terminal to the front stage latch portion when a mode switching signal is at a first level, and a feedback switch for connecting the rear stage latch portion to the front stage latch portion when the mode switching signal is at a second level, wherein a latch mode clock signal is provided as the aforementioned clock signal when the mode switching signal is at the first level, and a counter mode clock signal or front stage shift register latch output signal is provided as the aforementioned clock signal when the mode switching signal is at the second level, and said shift register functions in latch mode when the mode switching signal is at the first level, and functions with a plurality of stages thereof as a counter when at the second level.

The aforementioned objects are further achieved through the provision of a flash memory equipped with the plural shift registers, wherein the shift register group has both a function whereby command flags of decoded external command Signals are latched, and a counter function whereby counting is performed with said plural shift register stages.

DESCRIPTION OF THE PREFERRED EMBODIMENTS

Embodiments of the present invention will be described below with reference to the drawings. The technical scope of the present invention is in no way limited to or by these embodiments.

Figure 1:
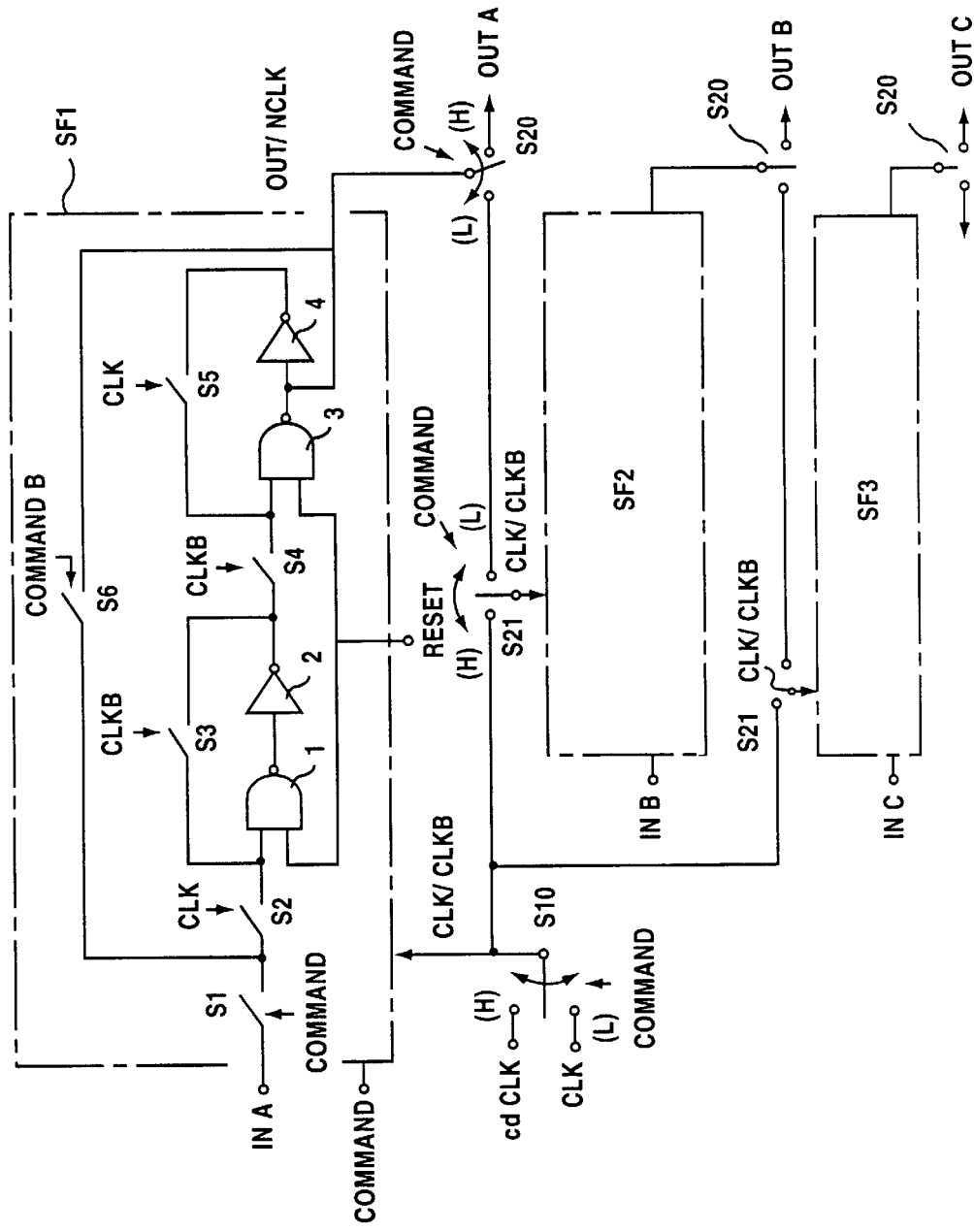
FIG. 1 is a general circuit diagram of the shift register pertaining to the invention.

FIG. 1 is a general circuit diagram of the shift register pertaining to the invention. The circuits SF1, SF2, and SF3, depicted by broken lines, are examples of the shift register circuit. This shift register circuit inputs, as input signals, a latch function input, INA, a clock signal, CLK, and a reset signal, RESET, as well as a mode switching signal, COMMAND, for switching between latch function and counter function. As output signals, a latch function output, OUT, and a counter function next stage clock, NCLK, are output.

The shift register circuit SF1 includes a front stage latch portion comprising a NAND circuit 1, an inverter circuit 2, and a switch S3, and a rear stage latch portion similarly comprising a NAND circuit 3, an inverter circuit 4, and a switch S5. These are connected by switches S2, S4, and so on. Switches S1 and S6 are controlled in opposition by switching signals, COMMAND and its inverted signal COMMAND B. When functioning as a latch circuit, the switch S1 is on and S6 is off so that input INA is simply latched. Conversely, when functioning as a counter, the switch S1 is off and S6 is on so that a feedback loop is formed, and a count-up operation is performed using the clock CLK and the inverted clock CLKB.

When the control clock CLK is H level, the shift register circuit SF1 inputs signals into the front stage latch portion, and when the clock CLK is L level (the inverted clock CLKB is H level), the front stage latch portion latches and the rear stage latch portion inputs the data.

The switch S10 is a switch for switching the control clock provided to the shift register SF between latch function and counter function, and is switched by means of the switching signal, COMMAND. cdCLK is the latch clock and CLK is the counter clock.

The switches S20 and S21 perform switching such that, in latch mode, the output of the shift register SF1 is obtained as output OUTA, and, in counter mode as a next stage clock NCLK which is delivered to the next stage shift register. The switch S21 is switched from the clock cdCLK in latch mode to the next stage clock NCLK in counter mode.

The switches S10, S20, S21, and so on are controlled by mode switching signals COMMAND. In the drawing, switch positions when the switching signals, COMMAND, are H level and when they are L level are shown. As clearly indicated thereby, during latch mode operation (when the switching signals COMMAND are H level), the shift registers SF1, 2, and 3 operate independently, a latch clock signal cdCLK is delivered, and the output thereof is provided to the output OUTA, OUTB, OUTC. Within the shift register circuit, the feedback loop switch S6 is off, and inputs INA, INB, and INC are input and latched within circuits SF1, SF2, and SF3.

During counter operation (when the switching signals command are L level), the shift registers SF1, SF2, and SF3 are connected in series, the output of the previous stage of the shift register serving as a next stage clock NCLK to the next stage shift register via the switches S20 and S21. The counter clock CLK is provided to the initial stage shift register SF1 only, via the switch S10. Within the shift register circuits SF1, SF2, and SF3, delivery of inputs INA, INB, and INC is prevented, the feedback loop switch S6 is turned on, and H and L level are output in alternating fashion by the control clocks CLK and CLKB. All switching is accomplished by switching signals, COMMAND, and its inverted signals, command B.

Figure 2:
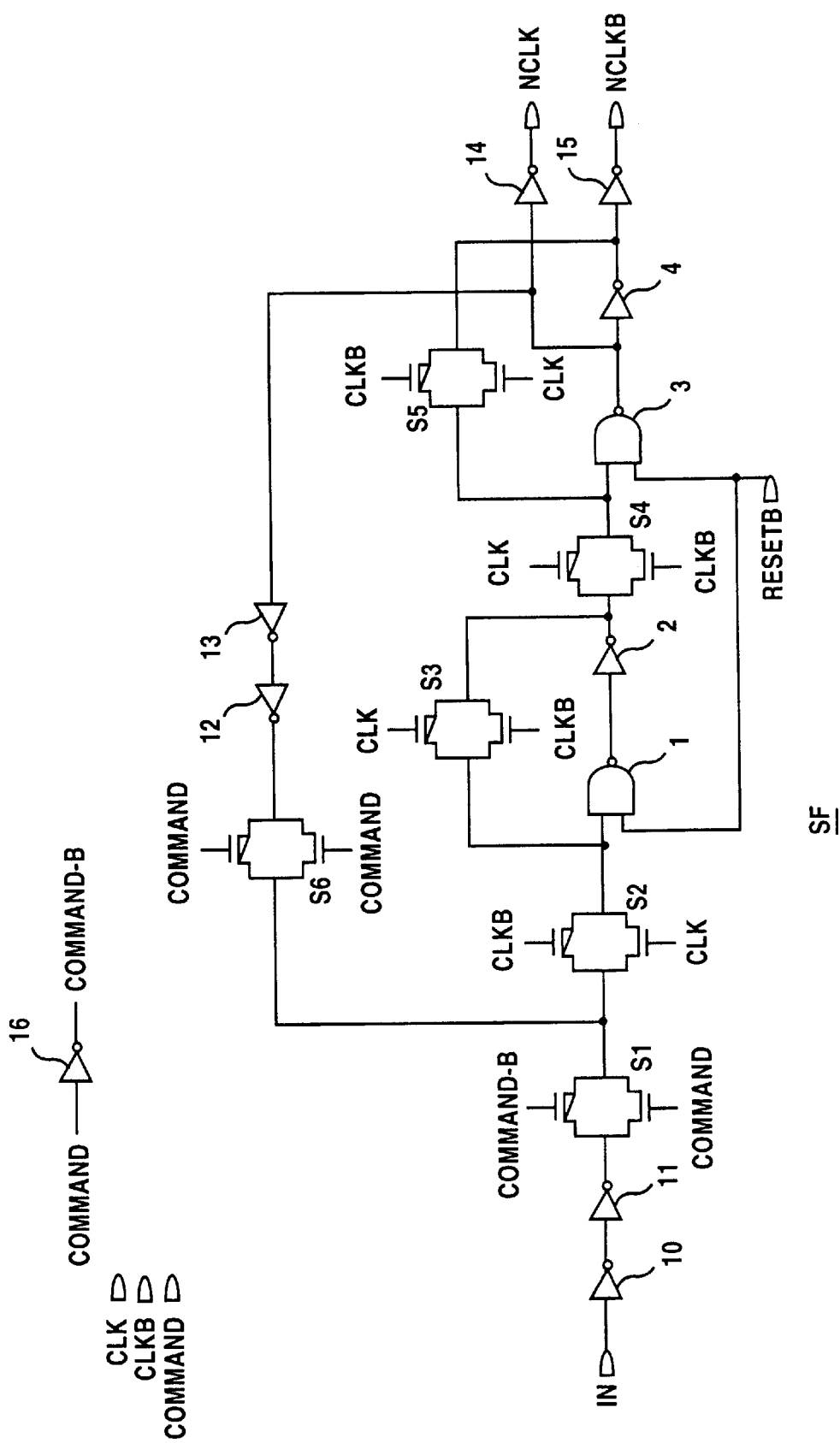
FIG. 2 is a detail circuit diagram of the shift register circuit.

FIG. 2 is a detail circuit diagram of a shift register circuit. Circuit elements identical to those in FIG. 1 are assigned the same symbols. In this circuit example, the switches S1 through S6 comprise CMOS switches. For example, a switching signal COMMAND is applied to the n-channel transistor (lower transistor) of switch S1, and an inverted signal COMMAND B is applied to the p-channel transistor (upper transistor) thereof. In switch S6, an inverted switching signal COMMAND B is applied to the n-channel transistor side. In switches S2 and S5, a clock CLK is applied to the n-channel transistor and an inverted clock CLKB is applied to the p-channel transistor. In switches S3 and S4, an inverted clock CLKB is applied to the n-channel transistor. Inverted and non-inverted signals NCLKB and NCLK are output simultaneously. 10 to 16 indicate the inverter circuits. As clearly shown in FIG. 2, the inputs are the input signal IN, the reset signal RESETB, the opposite control clocks CLK and CLKB, and the switching signal COMMAND. The inverted switching signal COMMAND B is generated internally by the inverter 16. The operation of this shift register circuit is the same as in FIG. 1.

Figure 3B:
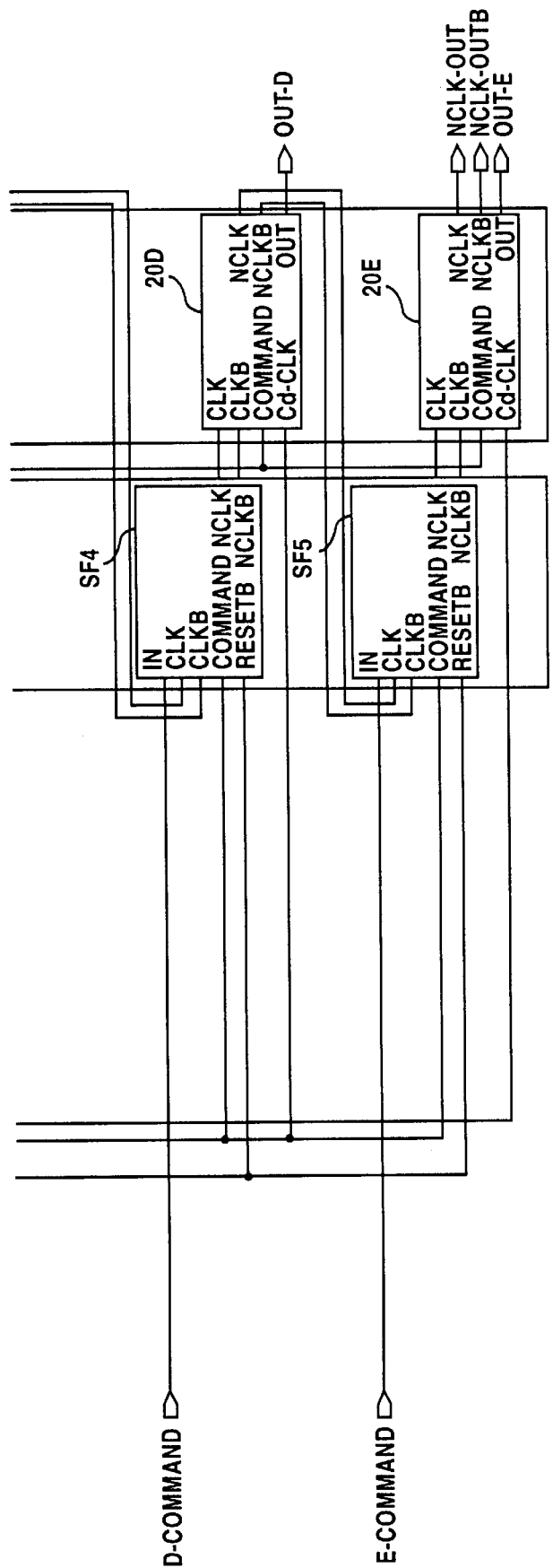
FIG. 3 is an example circuit showing the shift register circuit of FIG. 2 capable of functioning in both latch mode and counter mode.

FIG. 3 is a circuit example of a shift register circuit that can function in both latch mode and counter mode. In this example, the shift register SF1 is used exclusively in latch mode, and the shift registers 2 through 5 are used in both latch mode and counter mode. Command flags (decoded external command Signals) A command through E command are delivered to the inputs IN of the shift registers SF1 through SF5.

When shift registers SF1 through SF5 are switched to latch mode by switch signals COMMAND, complementary signals of the latch clock cdCLK are delivered to the input terminals CLK and CLKB of the shift registers SF1 and SF2 by switch S10. 20B through 20D, elements of switches S20 and 21, deliver the latch clock cdCLK to the input terminals CLK and CLKB of shift registers SF3, 4, and 5 via output terminals NCLK and NCLKB of the previous elements of switches 20B, 20C, and 20D. Shift register outputs OUTA~OUTE are generated by switches 20A~20E at its output terminals OUT. Since shift register SF1 is exclusively for use in latch mode, the clock outputs NCLK and NCLKB of switch circuit 20A are grounded. Likewise, since shift register SF1 is exclusively for use in latch mode, the counter clock input CLK of the upper switch S10A is grounded.

When shift registers SF1 through SF5 are switched to counter mode by switch signals COMMAND, the lower switch S10B delivers complementary signals of the counter clock CLK from the output terminals CLKSET and CLKSETB to the input terminals CLK and CLKB of the shift registers SF2. Next, the clock outputs NCLK and NCLKB of shift registers SF2 through SF4 are respectively delivered to the clock inputs CLK and CLKB of the next stage shift registers SF3 through SF5 through switches S20B, S20C, and S20D. As a result, serially connected counters SF2 through 5 are formed.

The dedicated latch mode shift register SF1 is reset by a reset signal ARESETB, and the latch/counter mode shift registers SF2 through SF5 are reset by a separate reset signal BRESETB. When all of the shift registers SF1 through 5 are functioning in latch mode reset, both reset signals ARESETB and BRESETB are used for resetting; when the shift registers SF2 through SF5 are operating in counter mode, they are reset individual by different reset signals BRESETB.

Figure 4:
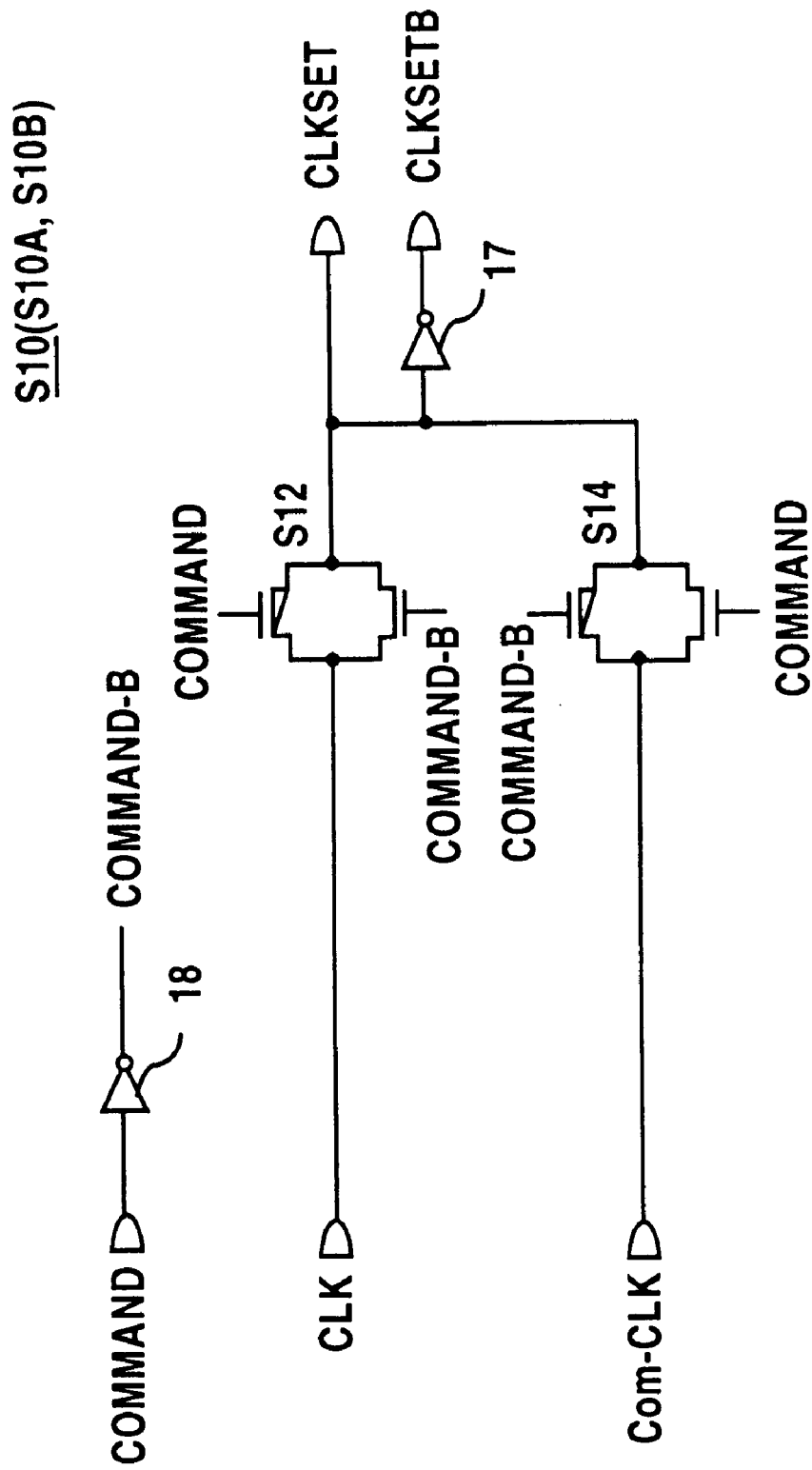
FIG. 4 is a detail circuit diagram of switch circuit S10.

FIG. 4 is a detail circuit diagram of switch circuit S10. As shown previously in FIG. 3, switch circuit S10 has as its inputs the switching signal COMMAND, the counter clock signal CLK, and the latch clock signal ComCLK. It outputs inverted and non-inverted signals CLKSET and CLKSETB of the appropriate clock, depending on the switching signal COMMAND. In the example of FIG. 4, when the switching signal COMMAND is H level, switch S14 is on and inverted and non-inverted signals CLKSET and CLKSETB of the latch clock signal ComCLK are generated. Conversely, when the switching signal COMMAND is L level, switch S12 is on and inverted and non-inverted signals CLKSET and CLKSETB of the counter clock signal CLK are generated.

Of the switch circuits S10 depicted in FIG. 3, the lower switch circuit S10B, which is connected to shift register SF2 (used in both latch and counter modes) is provided with both clock signals CLK and ComCLK, and is switched by the switching signal COMMAND in the manner described earlier. However, in the upper switch circuit S10A, which is connected to shift register SF1 (used exclusively in latch mode), the counter clock input CLK is grounded. Accordingly, shift register SF1 cannot be controlled by the counter clock input CLK.

Figure 5:
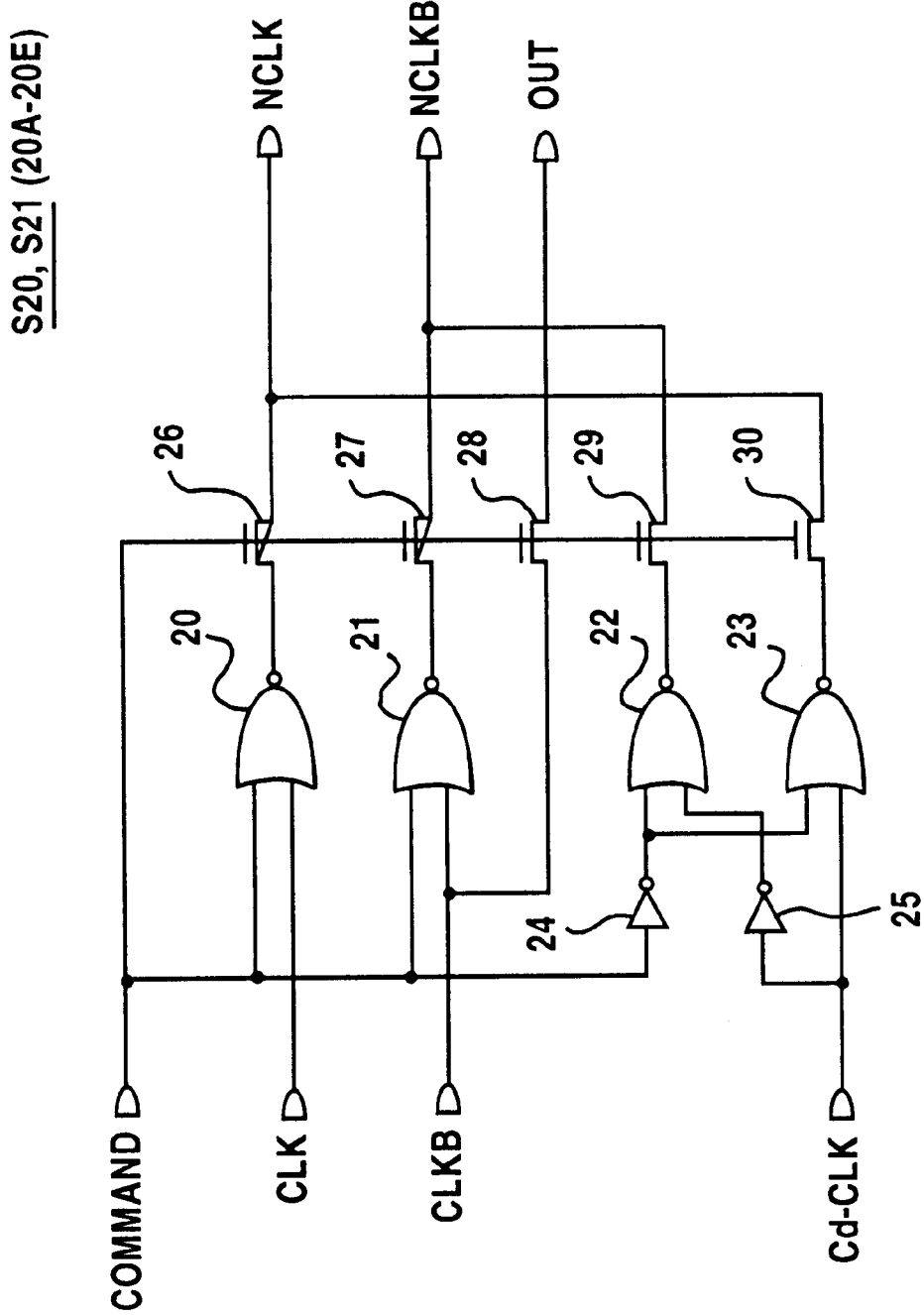
FIG. 5 is a detail circuit diagram of switch circuits S20 and 21.

FIG. 5 is a detail circuit diagram of switch circuits S20 and 21 (20A–20E). Switch circuits S20 and 21 are provided with the switching signal COMMAND, shift register outputs NCLK and NCLKB as its input signals CLK and CLKB, and the latch clock signal cdCLK as input signal cdCLK. A pair of clocks NCLK and NCLKB for delivery to the next stage and latch output OUT are generated at its output terminals.

When the switching signal COMMAND is H level, the shift registers SF1 through SF5 are placed in latch mode, and output of the NOR circuit 20 is forced to L level, and the p-transistors 26 and 27 turn off. The NOR circuits 22 and 23 generate output in accordance with the latch clock signal cdCLK. Then, with the n-transistors 29 and 30 on, inverted and non-inverted signals of the latch clock signal cdCLK are output at the outputs NCLK and NCLKB. The n-transistor 28 is also on, and the input CLKB provided by the output NCLKB of the corresponding shift register is output as latch output OUT. Accordingly, the inputs CLK and CLKB of the shift registers SF3, SF4, and SF5 of FIG. 3 are provided with complementary signals of the latch clock through the outputs NCLK and NCLKB of the front stage switch circuits 20B, 20C, and 20D.

When the switching signal COMMAND is L level, the shift registers SF1 through SF5 are placed in counter mode, and the NOR circuits 20 and 21 generate outputs corresponding to the inputs CLK and CLKB provided by the output pair NCLK and NCLKB from the front stage shift registers. Clock signals NCLK and NCLKB for the next stage are output via the p-transistors 26 and 27, which are on. The n-transistors 28, 29, and 30 are off.

Thus, by connecting the shift register circuit of FIG. 2 and the switch circuits of FIGS. 4 and 5 in the manner shown in FIG. 3, the shift registers SF2, 3, 4, and 5 can function in both latch mode and counter mode.

Figure 6:
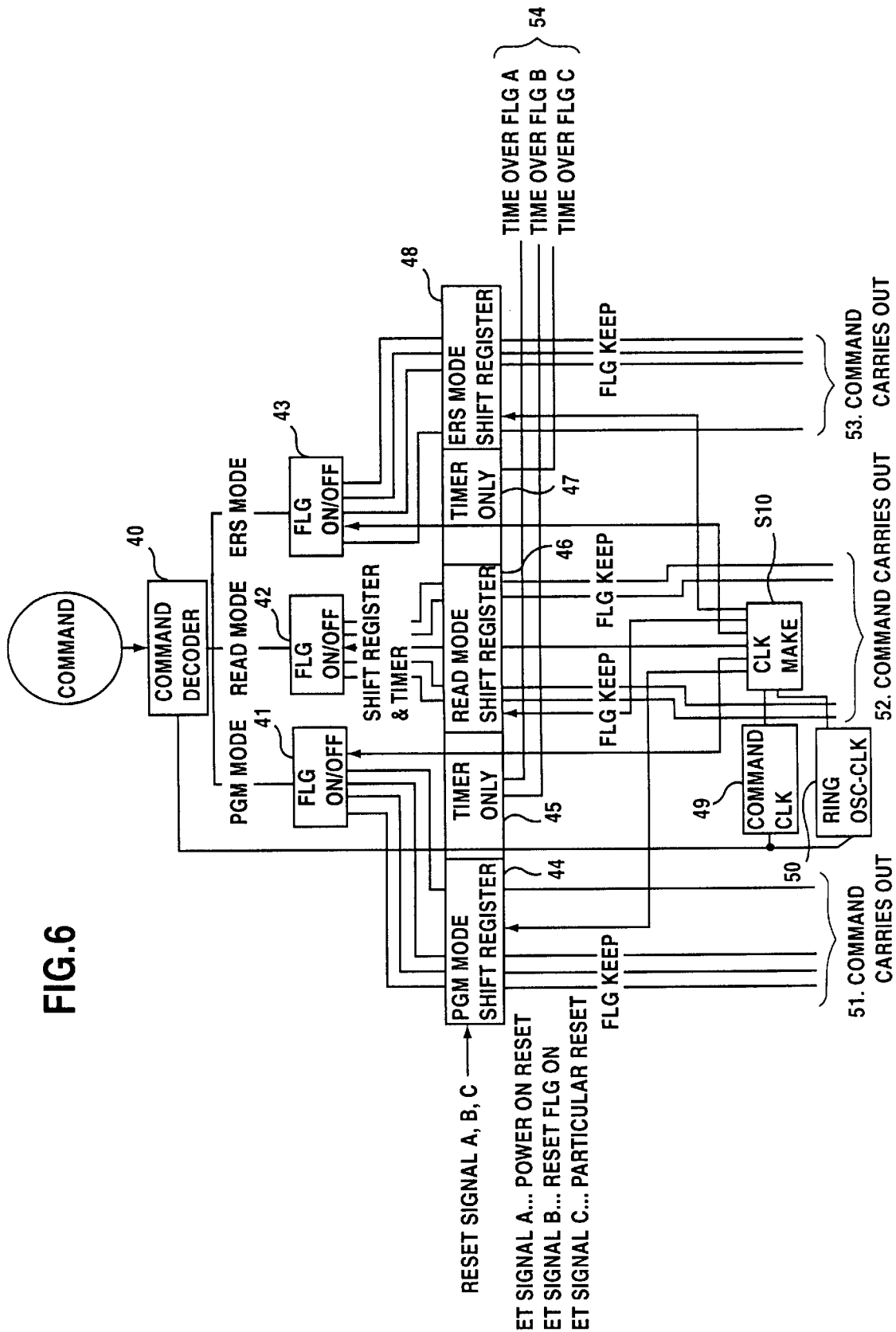
FIG. 6 is an example circuit showing the shift register of the present invention implemented in the logic circuit section of a flash memory.
Figure 7:
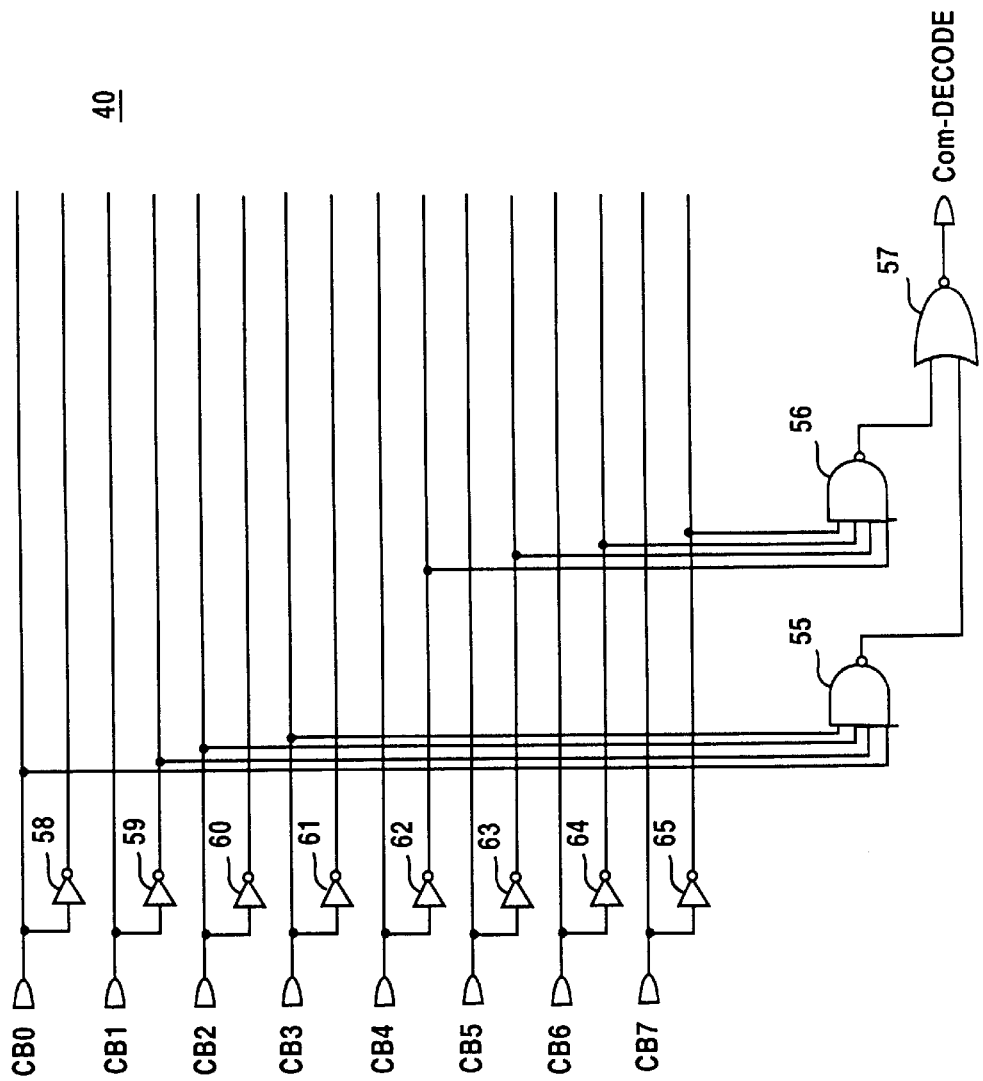
FIG. 7 is a command decoder circuit example.

FIG. 6 is an example circuit in which the shift register of the present invention is used in the logic circuit section in a flash memory. FIG. 7 is an example of a command decoder circuit therein. In the example of FIG. 6, an external command Signal of prescribed bit length is provided to the command decoder 40. The command is decoded in the flash memory, the operating mode is selected, and the internal logic circuits, particularly the shift register circuit, are switched to latch mode or counter mode in accordance with the selected operating mode.

In FIG. 7, which depicts an example of the command decoder, an 8-bit command Signal Cb 0 through 7 is decoded by inverters 58 through 65 and NAND and NOR circuits 55, 56, and 57. A decoded signal Comdecode is output. In FIG. 7, only part of the decoder is shown; actually, a plurality of decoded signals is generated. As shown in FIG. 6, the decoded signals pass through the corresponding flag on/off circuits 41, 42, and 43 and, together with the switching signal command, are provided as command flag signals to the shift register circuit groups 44 through 48.

In the example of FIG. 6, the shift register group 44 functions in both a program (write) flag latch mode and counter mode. The shift register group 46 functions in both a read flag latch mode and counter mode. The shift register group 48 functions in both an erase flag latch mode and counter mode. The other shift register groups 45 and 47 are used in counter mode exclusively. The latched flag outputs are output as 51, 52, and 53. In counter mode, a counter flag indicating, for example, timeout, is output as 54. 49 is a circuit for generating the latch clock signal cdCLK and 50 is a ring oscillator circuit for generating the counter clock CLK.

Figure 8:
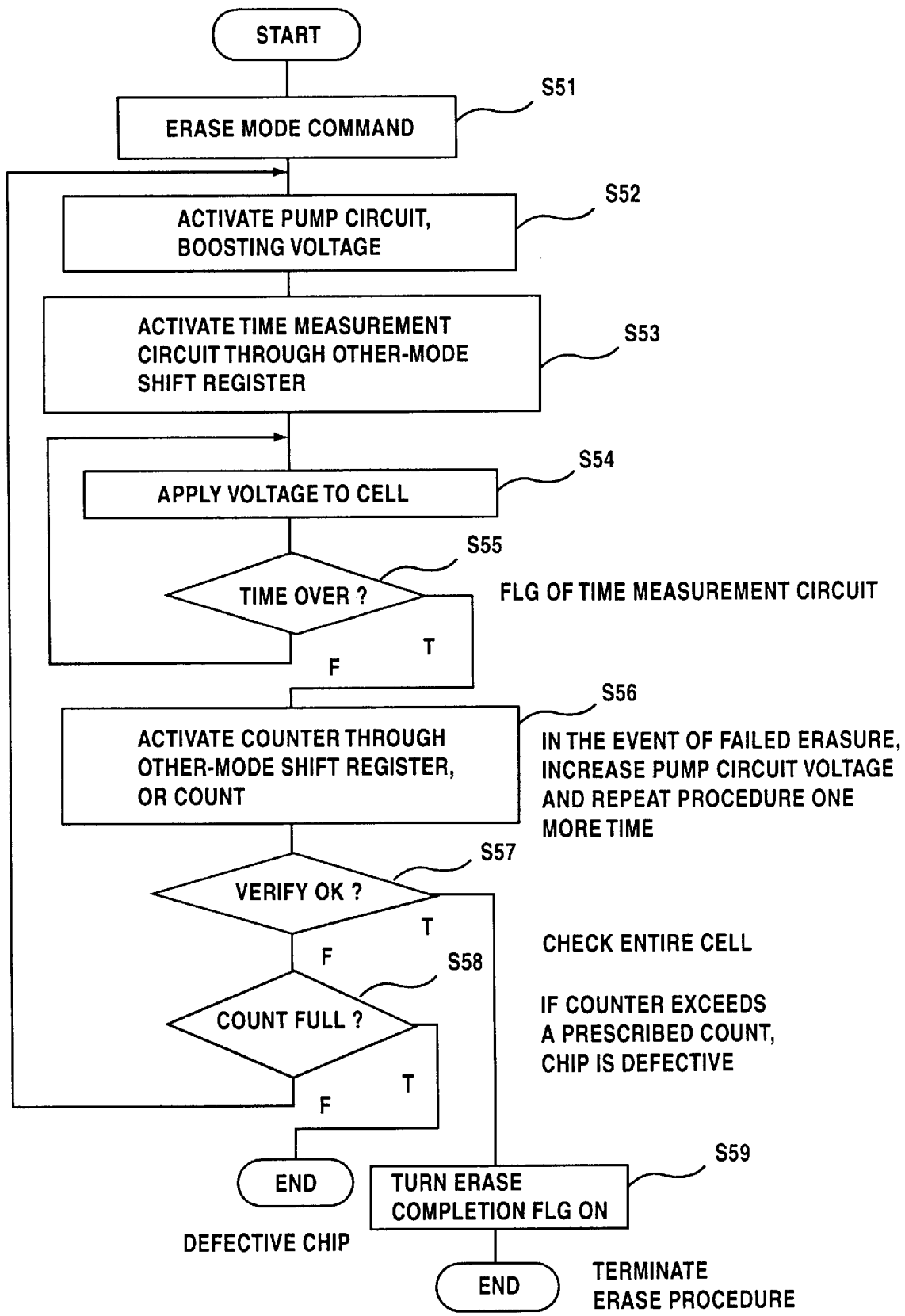
FIG. 8 is a flow chart depicting an example of the flash memory erase procedure.

FIG. 8 is a flow chart depicting an example of the flash memory erase procedure. When an external erase mode command is entered, the command decoder 40 discerns this and erase mode is assumed (S51). Next, an internal booster circuit (pump circuit) is activated and the voltage required for erasure is generated (S52). Next, a different-mode shift register (one in which an erase mode flag is not latched) or the like is switched to the counter mode, and activated so as to function as a time measurement circuit (S53). Erasing voltage is then applied to the memory cell for the period of time required for erasure (S54, S55). During the counter operation, when the timer flag 54 from the corresponding shift register circuit rises, application of the erasing voltage is terminated. Next, another different-mode shift register is switched to the counter mode (S56), and the success of erasure is checked (S57). In the event of failed erasure, the erase procedure is repeated beginning from step S52 through step S55. In the event that a prescribed number of failed erases is detected by the counter activated in step S56 (S58), the chip itself is deemed defective. In the event of successful erasure, an erasure completion flag is turned on (S59) and the erase procedure is terminated.

The use of shift register circuits in a flash memory in the manner described above makes possible operation in both latch mode and counter mode. In counter mode, registers can be used as time measurement circuits in some instances, and in other instances as circuits for counting the number of erase operations.

As indicated in the foregoing discussion, the present invention allows shift register circuits to function in both latch mode and counter mode, and accordingly allows the number of internal circuits to be reduced and contributes to increased integration.

What is claimed is:

1. A flash memory provided with a plurality of shift registers and being given a command signal from outside, each shift register having a plurality of register circuits, wherein the register circuits comprise:

a data input terminal;

a mode switching terminal;

a clock terminal;

a data input terminal;

a front stage latch portion for inputting input data when a clock signal delivered to the clock terminal is at a first level, and latching the input data when the clock signal is at a second level;

a rear signal latch portion for inputting data from the front stage latch portion when the clock signal is at the second level, and latching the input data and delivering the latch output signal to the data output terminal when the clock signal is at the first level;

an input switch for connecting the data input terminal to the front stage latch portion when a mode switching signal delivered to the mode switching terminal is at a first level; and a feedback switch for connecting the rear stage latch portion to the front stage latch portion when the mode switching signal is at a second level; and the shift register further comprises:

a first switch for delivering a latch mode clock signal to the clock terminal of an initial stage register circuit when the mode switching signal is at the first level, and delivering a counter mode clock signal to the clock terminal of the initial stage register circuit when the mode switching signal is at the second level; and a second switch for delivering the latch mode clock signal to the clock terminal of a register circuit other than the initial stage register circuit when the mode switching signal is at the first level, and delivering the latch output signal from a previous stage register circuit to the clock terminal when the mode switching signal is at the second level;

and wherein the shift register group has both a function whereby command flags which are obtained by decoding the command signals given from outside are latched at each register circuit.

* * * * *

UNITED STATES PATENT AND TRADEMARK OFFICE
CERTIFICATE OF CORRECTION

PATENT NO. : 5,926,520
DATED : July 20, 1999
INVENTOR(S) : Masaru Yano

It is certified that error appears in the above-identified patent and that said Letters Patent is hereby corrected as shown below:

Column 6,
Line 28, delete "input" and substitute therefor -- output --; and
Line 61, delete "shift register group has both" and substitute therefor -- plurality of shift registers have --.

Signed and Sealed this

Twenty-seventh Day of January, 2004

JON W. DUDAS
*Acting Director of the United States Patent and Trademark Office*